(12) United States Patent
König et al.

(10) Patent No.: US 11,192,801 B2
(45) Date of Patent: Dec. 7, 2021

(54) WATER PURIFICATION SYSTEM AND DISTILLATION UNIT

(71) Applicant: MITTEMITTE GMBH, Berlin (DE)

(72) Inventors: Moritz König, Berlin (DE); Faebian Bastiman, Berlin (DE); Fernando Fernandes, Berlin (DE); Moritz Waldstein-Wartenberg, Berlin (DE)

(73) Assignee: MITTEMITTE GMBH, Berlin (DE)

( * ) Notice: Subject to any disclaimer, the term of this patent is extended or adjusted under 35 U.S.C. 154(b) by 0 days.

(21) Appl. No.: 16/481,833

(22) PCT Filed: Feb. 1, 2018

(86) PCT No.: PCT/EP2018/052585
§ 371 (c)(1),
(2) Date: Jul. 30, 2019

(87) PCT Pub. No.: WO2018/141883
PCT Pub. Date: Aug. 9, 2018

(65) Prior Publication Data
US 2019/0375656 A1    Dec. 12, 2019

(30) Foreign Application Priority Data

Feb. 1, 2017  (EP) .................................... 17154125
Jun. 28, 2017 (EP) .................................... 17178304

(51) Int. Cl.
*C02F 1/04* (2006.01)
*B01D 1/00* (2006.01)
(Continued)

(52) U.S. Cl.
CPC ............ *C02F 1/043* (2013.01); *B01D 1/0017* (2013.01); *B01D 5/006* (2013.01); *B01D 5/0015* (2013.01);
(Continued)

(58) Field of Classification Search
CPC ..... C02F 1/04–1/18; B67D 2210/0002; B01D 5/0042; B01D 5/006
See application file for complete search history.

(56) References Cited

U.S. PATENT DOCUMENTS 3,310,953 A *  3/1967  Rait ....................... F25B 21/02
                                                    62/3.62
3,801,284 A    4/1974  Meckler
(Continued)

FOREIGN PATENT DOCUMENTS

CA        2292383       6/2001
CN        204698363     10/2015
(Continued)

*Primary Examiner* — Jonathan Luke Pilcher
(74) *Attorney, Agent, or Firm* — JMB Davis Ben-David (57) ABSTRACT

The invention relates to a water purification system and distillation unit.
The water purification system (3) comprises an input section (31) for providing water (21), in particular tap water, to a distillation unit (1), and said distillation unit (1) for producing distilled water. Said distillation unit comprises an evaporation section (12) for evaporating said water (21) and producing steam (23), and a condensation section (14) for at least partly condensing said steam (23), producing distilled water. The system further comprises a first admixing unit (32), in particular a cartridge, which is arranged and configured in such a way that it is enabled for admixing compounds, in particular minerals, to said distilled water, producing enriched distilled water, and an output section (33) for dispensing said enriched distilled water. Said evaporation section (12) is provided by a heatable side (101) of a first Peltier effect device (10) and said condensation section (14) is provided by a coolable side (102) of said first Peltier effect device (10).

8 Claims, 4 Drawing Sheets

(51) Int. Cl.
  *B01D 5/00*     (2006.01)
  *C02F 1/68*     (2006.01)
  *C02F 9/00*     (2006.01)
  *C02F 1/28*     (2006.01)
  *C02F 1/50*     (2006.01)
  *C02F 103/00*   (2006.01)

(52) U.S. Cl.
  CPC ......... *B01D 5/0039* (2013.01); *B01D 5/0042* (2013.01); *C02F 1/688* (2013.01); *C02F 9/005* (2013.01); *C02F 1/283* (2013.01); *C02F 1/505* (2013.01); *C02F 2103/001* (2013.01); *C02F 2103/007* (2013.01); *C02F 2201/006* (2013.01); *C02F 2209/008* (2013.01); *C02F 2209/02* (2013.01); *C02F 2209/05* (2013.01); *C02F 2209/10* (2013.01); *C02F 2209/42* (2013.01); *C02F 2303/10* (2013.01); *C02F 2307/10* (2013.01)

(56) References Cited

U.S. PATENT DOCUMENTS

| | | | | |
|---|---|---|---|---|
| 3,856,676 | A | * | 12/1974 | Grimme, Jr. ......... B67D 1/0014 |
| | | | | 210/96.1 |
| 4,660,741 | A | * | 4/1987 | Kirschner ............. B01D 24/12 |
| | | | | 210/416.1 |
| 2011/0147194 | A1 | * | 6/2011 | Kamen ................... B01D 1/02 |
| | | | | 202/185.1 |

FOREIGN PATENT DOCUMENTS

| | | |
|---|---|---|
| CN | 204698363 U | 10/2015 |
| DE | 102008007984 | 8/2009 |
| EP | 0837290 | 4/1998 |
| WO | 9967004 | 12/1999 |
| WO | 9967004 A1 | 12/1999 |
| WO | 2009138818 | 11/2009 |
| WO | WO-2009138818 A1 * | 11/2009 ........... B01D 1/2843 |

* cited by examiner

WATER PURIFICATION SYSTEM AND DISTILLATION UNIT

CROSS-REFERENCE TO RELATED APPLICATIONS

This is the U.S. National Stage of International Patent Application No. PCT/EP2018/052585 filed Feb. 1, 2018, which claims priority to European Patent Application Nos. 17154125.3 filed Feb. 1, 2017, and 17178304.6 filed Jun. 28, 2017.

The production of safe and affordable drinking water is an important goal all over the world. A variety of water purification processes exists. However, in a majority of processes, dissolved compounds remain in the water. In many regions, tap water is not suitable for drinking without further treatment. This may be due to substances that affect taste and/or odor of the water or due to potentially harmful substances. Thus, in many places and households throughout the world, there is a desire to enhance the quality of tap water as provided by the local water companies.

Several processes exist that are suitable for a complete elimination of dissolved compounds. A common one is distillation. However, this process is rarely used for domestic water purification as it is an energy-intensive process. Besides, it implies additional processing, as distilled water is not suitable for regular human consumption. An addition of minerals is needed to produce a drinkable product.

WO 93 25 478 discloses an apparatus and a process for the production, particular domestic production, of beverages. The process involves distillation, sterilization and remineralization of an aqueous influent. The latter is performed by dissolving a soluble tablet with a predetermined mineral composition by means of mixer.

WO 2009 037 610 A2 describes a similar device for producing drinking water. Salt is added in the form of an aqueous solution and admixed with a mixing means which also realizes aeration of said water.

U.S. Pat. No. 4,894,123 discloses a domestic distillation unit for producing distilled water with a vertical steam chimney and an internally positioned water chimney for preheating said water. The distillation unit comprises an air-cooled fin-and-tube heat exchanger for condensation of the steam. Heating is realized with an electrical heating element.

US 2010 0 300 868 A1 describes another domestic device for producing drinking water. After distillation, salt can be added with a salt supply system and a mixing system using a concentrated aqueous solution.

Furthermore, solutions are known which involve different purification processes. U.S. Pat. No. 3,785,492 discloses an apparatus for a similar purpose. However, demineralization is performed by fractional crystallization rather than by distillation. US 2006 02 07 869 A1 describes a water purification unit comprising a system for degassing water, super heating it up to more than 175° C. and exploding the water into a vacuum chamber. Subsequently, the produced steam is condensed.

All described solutions require high amounts of energy per water volume for distillation. An alternative process with significantly lower energy consumption involves distillation by means of a thermoelectric device based on the Peltier effect. DE 1 194 372 discloses a process for the distillation of liquids using the Peltier effect for heating the water to be distilled. The described apparatus design involves a heat exchanger for preheating the water to be evaporated with the high temperature of the condensate. However, due to thermodynamic principles and as the Peltier element generates more heat than cold, this process is only feasible if a significant portion of heat is dissipated to the exterior through the housing. Alternatively, a portion of steam would remain and leave the apparatus as gas phase.

U.S. Pat. No. 3,212,999 discloses a sea water desalination system comprising a Peltier heat pump for transferring heat from a cold thermojunction member, contacting the steam to be condensed, to a hot thermojunction member, contacting the water to be evaporated, to produce said steam.

U.S. Pat. No. 6,805,774 B2 describes a process and apparatus for purifying liquids with a thermoelectric module. Fresh water is evaporated on a hot surface of a said module and parts of the steam are condensed on a cold surface of said module. The remaining steam is used to preheat the water to be evaporated, contacting a heat exchanger surface in the upper portion of the device which forms the bottom of the water tank, whereby it is condensed. The distilled water leaves the distillation unit at a water outlet. However, also this process only works if a significant portion of heat leaves the apparatus through the side walls or if a water-steam mixture leaves the apparatus.

U.S. Pat. No. 6,893,540 B2 describes a distillation apparatus comprising a heating section, a condenser section and a Peltier effect device. The Peltier effect device is in contiguous contact with the heating section and the condenser section to transfer heat from the condenser section and to transfer heat to the heating section, respectively.

U.S. Pat. No. 5,484,510 discloses a water distillation apparatus comprising a heating element and a preheater. It further comprises a detection system suitable to detect electrical conductivity in generated steam.

U.S. Pat. No. 4,089,750 discloses a water distiller arrangement including a preheater in the shape of an interior chamber surrounded by a hollow space though which the vapor passes while condensing. U.S. Pat. No. 4,342,625 describes a water distillation apparatus with a heat exchanger to preheat the water to be evaporated by the steam to be condensed. U.S. Pat. No. 4,415,075 describes a compact, fully automatic water distilling unit also comprising a preheater.

The problem to be solved is to provide a water purification system and a distillation unit which are suitable for an energy-efficient and cost-effective distillation of water.

The problem is solved with the water purification system and the distillation unit. Advantageous embodiments of the water purification system are described, and advantageous embodiments of the distillation unit are also described.

A first aspect of the invention is a water purification system, comprising an input section for providing water, in particular tap water, to a distillation unit, and said distillation unit for producing distilled water. Said distillation unit comprises an evaporation section for evaporating said water and producing steam and a condensation section for at least partly condensing said steam, producing distilled water. The system further comprises a first admixing unit, in particular a cartridge, which is arranged and configured in such a way that it is enabled for admixing compounds, in particular minerals, to said distilled water, producing enriched distilled water, and an output section for dispensing said enriched distilled water. Said evaporation section is provided by a heatable side of a first Peltier effect device and said condensation section is provided by a coolable side of said first Peltier effect device.

Said sections being provided by said first Peltier effect device means that a thermal connection is realizable between said heatable side and said water to be evaporated and between said coolable side and said steam to be condensed for transferring thermal energy. This also holds for the respective specifications of the distillation unit according to the invention.

Peltier effect devices, also known as Peltier elements or thermoelectric elements, are suitable for transferring or pumping heat from a coolable part to a heatable part when applying an electrical current. The first Peltier effect device is configured to heat the heatable side relative to the coolable side and therefore pump heat from the steam to be condensed to the water to be evaporated. It is used as a dual-function device, simultaneously evaporating water and contributing to condensation of the steam. The first Peltier effect device can comprise a combination of several thermoelectric elements, e.g. connected in series. There may be more than one Peltier effect device comprising heatable and coolable sides for providing at least one evaporation section and at least one condensation section.

The input section may be any device suitable to provide water to the distillation unit, such as an input tank or an input water feed line to be connected with the water network. It may comprise a suitable input pressure regulation device such as a valve. A filter for particle removal may be arranged between input section and distillation unit. A pump may be used for a controlled inputting of water into the distillation unit.

The evaporation section is suitable for evaporating water and producing steam. It is thus arranged and configured in such a way that a thermal interaction between said heatable side and the water to be evaporated can be established. It may be formed as an evaporation chamber. In particular, said evaporation section is a separated volume connected with two flow paths. It may be in fluid connection with said input section or, if applicable, with a heat exchanging section of said distillation unit for realizing an inflow of water or fluid to be evaporated. In addition, it may be in fluid connection with said condensation section such that the produced steam or gas phase can leave said evaporation section and flow into said condensation section in order to be condensed. Said heatable side of said first Peltier effect device is arranged such that a thermal connection to said water or fluid to be evaporated can be established. In particular, it is arranged inside said evaporation section and/or forms at least a part of a wall delimiting said evaporation section. The condensation section is connected with said evaporation section such that said steam can flow from said evaporation section to said condensation section. Said condensation section, e.g. realized as condensation chamber, may be realized to transfer heat from the steam to the coolable side of said first Peltier effect device and at least partly condense said steam. The condensation section is thermally connectable or connected with said coolable side. It may be configured to condense parts of the steam producing a two-phase mixture comprising evaporated water and steam. In particular, said condensation section is a separated volume connected with two flow paths. It may on the one hand be in fluid connection with said evaporation section for realizing an inflow of said steam or gas phase to be condensed, as described. On the other hand, it may be in fluid connection with a distillation unit outlet or with said first admixing unit for realizing an outflow of said distilled fluid, for example water, or said two-phase mixture. Said coolable side of said first Peltier effect device is arranged such that it is in thermal connection with steam or gas phase to be at least partly condensed. In particular, it is arranged inside said condensation section and/or forms at least a part of a wall delimiting said condensation section. Typically, neither said evaporation section nor said condensation section serve for storing said liquid and/or gas phase.

Typically, a connecting element is arranged between said evaporation section and said condensation section of said distillation unit of the water purification system for realizing a flow path between said sections. Said flow path enables produced steam to enter said condensation section.

The evaporation section may comprise anti-bumping granule, for example small pieces of inert solid material, in order to achieve steady boiling.

The admixing unit is in particular a cartridge for a basis mineralization of said distilled water. It may be a flow-through cartridge for dissolving solid minerals which lasts for a hundred liters of water or more.

Typically, the water purification system according to the invention is suitable for domestic use. It may be constructed as a domestic device. It may be suitable to produce more than 5 liters distilled water per day, in particular between 12 and 30 liters per day. The distillation unit may be designed to produce 0.1 liter per hour to 2 liters per hour, in particular 0.3 liters per hour to 1 liter per hour. The system may be able to provide one liter of distilled water or enriched distilled water within two minutes.

The use of the first Peltier effect device allows for a very efficient evaporation and condensation and, thus, enables the water purification system to carry out a very efficient water purification process. Peltier effect devices with the required shape and specifications are a standard product.

In one embodiment, the water purification system comprises a decalcification means, in particular an ion exchanger, e.g. comprising synthetic resin, for removing calcium and/or magnesium from the water, wherein said decalcification means is arranged upstream of said distillation unit, in particular upstream of said evaporation section, for reducing calcium and/or magnesium concentrations in said water prior to distillation. It may be arranged within a raw water tank or a second tank of said water purification system.

A decalcification means may be any means suitable for reducing calcium and/or magnesium concentrations. An ion exchanger may e.g. be suitable to replace calcium and/or magnesium ions by sodium ions. Reduced calcium and/or magnesium concentrations prevent calcification of the evaporation section. Said decalcification means may be adapted for regeneration, in particular by means of sodium dissolved in water.

In one embodiment the water purification system comprises a second admixing unit arranged downstream of said condensation section. Said second admixing unit is configured in such a way that it is enabled for admixing ingredients to said distilled water and/or to said enriched distilled water.

In particular, the second admixing unit is suitable for adding additional minerals, vitamins and/or taste compounds to the respective water. This may be realized in a flow-through system with single-use capsules which are suitable for a predefined water volume. Said capsules may particularly contain powdered ingredients such as health promoters and/or flavoring ingredients after use.

The second admixing unit is arranged downstream of said condensation section, so, in particular, distilled water is used for admixing ingredients.

In another embodiment, said second admixing unit is suitable to admix ingredients retained in an ingredient capsule, said second admixing unit comprising a capsule positioning element to position and in particular to fix said ingredient capsule during an admixing process.

In particular, the second admixing unit is suitable to successively admix a plurality of ingredient capsules to a plurality of volume units of the respective water. It may comprise a feed unit for inserting said ingredient capsules into the system and a position element to position said capsules for the admixing process. In particular, said second admixing unit further comprises a removal unit for removing said ingredient capsules.

In a further embodiment, the water purification system comprises a first cooling unit suitable for transferring thermal energy from said distilled water and/or said steam to an air flow. Said first cooling unit is arranged downstream of said condensation section and upstream of said output section.

Typically, due to thermodynamic principles and as the Peltier element generates more heat than cold, the condensation in the condensation section remains incomplete. This is especially the case in a well-insulated distillation unit, which is desired for the purpose of energy efficiency. In particular, the system comprises a heat insulation suitable for essentially incorporating at least parts of the distillation unit into a thermally insulated section. A mixture of distilled water and steam may leave the condensation section and parts of the remaining steam or the remaining steam in its entirety may be condensed inside the first cooling unit which is, thus, suitable for increasing the overall efficiency of the water purification system.

Said first cooling unit being arranged downstream of said condensation section in particular means that it is a separate device which does not influence processes of said condensation section. It is arranged for reducing the thermal energy of said distilled water and/or said steam coming from said condensation section.

Under certain conditions, however, it may be possible that condensation is performed entirely in the condensation section. This may for example be the case at very low distillation rates and a very cold raw liquid.

Cooling is realized e.g. with a heat exchanger and a fan that increases the heat transfer from the hot fluid to the cool air stream. The first cooling unit may alternatively be located downstream of the first or second admixing unit. It may be suitable for cooling the respective water to a desirable temperature for consumption.

In one embodiment, the water purification system comprises a second cooling unit having a second Peltier effect device with a heatable and/or coolable heat transfer surface. Said second cooling unit is arranged downstream of said condensation section and upstream of said output section. Said heat transfer surface is suitable for transferring thermal energy to and from said distilled water and/or said enriched distilled water.

Said heat transfer surface is particularly heatable and coolable. Thus, said second cooling unit is particularly configured to cool down or heat up said distilled water or said enriched distilled water, respectively, before or after the second admixing unit. It may be suitable to realize a temperature between 4 and 50° C., depending on the desired temperature and the actual temperature.

In other words, cooling and heating can be realized with one heat transfer surface. This may be realized with one second Peltier effect device, wherein the functionality is controlled via the direction of the current flow. In particular, when cooling the respective water, thermal energy can be transferred from it to an air flow which contacts a heating part of the second cooling unit. The second Peltier effect device thus constitutes a heat pump, transferring heat from the heating part to the cooling part with electricity.

In particular, the water purification system further comprises a controlling device for controlling at least the first Peltier effect device, an input unit for inputting information, wherein the input unit is electrically or electronically connectable or connected to the controlling device, and an output unit for displaying information, wherein the output unit is electrically or electronically connectable or connected to the controlling device. For example, the output unit may be configured to output values measured by at least one sensor, as specified below. It may give information on the selected temperature, on the status of the first and/or second admixing unit such as low level warning for the mineralization cartridge and/or ingredients contained. The output unit may be realized as an interactive interface.

The water purification system may be controllable via an app. Said app may be configured to realize the initiation of different functions such as starting of the system, starting of a water purification process comprising evaporation and condensation and/or starting of an admixing and/or dispensing process. Therefore, it is configured to establish a suitable connection, in particular wireless, to suitable device such as a portable electronic device.

In a further embodiment, the water purification system comprises a first tank for storing said distilled water and/or said enriched distilled water, said first tank being arranged downstream of said condensation section. Said second cooling unit is arranged and configured in such a way that it is enabled to increase and decrease the water temperature in said first tank.

In a further embodiment, the water purification system comprises a first tank for storing said distilled water and/or said enriched distilled water, said first tank being arranged downstream of said condensation section. Said second cooling unit is arranged and configured in such a way that it is enabled to decrease the water temperature in said first tank.

The cooling part of the second cooling unit may be arranged inside the first tank so that it contacts the contained distilled water and/or remineralized distilled water. Alternatively, it may be arranged in an inflow of the first tank or e.g. in a cooling cycle starting from and ending in the first tank. In particular, the first tank is arranged and configured to store said enriched distilled water after leaving the first admixing unit.

Said second cooling unit may also be suitable to increase the water temperature in said first tank. Increase and decrease of the temperature may be realizable with one single heat transfer surface by reversing the current flow direction, as described. Thus, any desired temperature in a broad range can be selected. In this embodiment, the second admixing unit is suitable for maintaining a predefined temperature inside said first tank.

Said first tank may be manufactured from NAS, a Styrene based plastic; SAN, a Styrene Acrylonitrile; PEX, Cross linked polyethylene; glass, in particular BPA free, or Stainless steel, e.g. type 304 or 316. In particular, a food safe Polypropylene with high strength and high heat resistance such as PP-HJ730 may be used.

In one embodiment, the water purification system comprises a heating unit, in particular a flow through heater, for heating said distilled water and/or said enriched distilled water. Said heating unit is arranged upstream of said output unit and in particular arranged downstream of said first tank. In this embodiment, the temperature of said enriched distilled water to be dispensed can be chosen according to the requirements of the user.

In one embodiment, said input section of the water purification system further comprises a second tank for storing water, in particular tap water, said second tank being arranged upstream of said evaporation section. Said water purification system may further comprise a sensor such as a load cell for measuring the amount of water stored in said second tank. Alternatively, any kind of sensor may be used in order to determine the stored amount of water. For example, an incremental level sensor based on a floating magnet and corresponding magnet switches may be used.

The first and/or second tank may comprise a volume between one and ten liters, in particular between two and eight liters.

In another embodiment, the water purification system comprises at least one first sensor for the determination of total dissolved solids, said first sensor being arranged upstream of said output section.

For example, a first sensor based on an electrical conductivity measurement may be used. The first sensor is particularly suitable for determining the quality of the distilled water. It may be arranged and configured to measure the total dissolved solids concentration after condensation of the steam. Additionally or alternatively, such first sensors may also be placed to measure the quality of the enriched distilled water and/or of the raw water.

The described water purification system may also be used for the purification of heavier polluted water, as the included distillation unit removes all a big proportion of said contaminants. For this purpose, e.g. for the purification of rain water or surface water such as river water, lake water or sea water, the system may comprise an additional, suitably designed filter, being arranged upstream of the evaporation section. This filter, which is particularly configured to remove a large part of the possibly contained particular matter, may be suitable for backwash, cleaning and/or emptying in order to provide a long-term or permanent use. Such a water purification system may be dimensioned significantly bigger than a system for domestic use as described.

Besides the distilled water, the distillation unit typically produces a concentrate containing a high concentration of the water ingredients. The concentrate may be discharged by a suitable connection to the drain, e.g. by a tube into a sink. The water purification system may further comprise a third tank for storage of said concentrate produced by the distillation unit. The distillation unit may comprise means for discharging said concentrate, e.g. periodically or if the water level in a compartment of the distillation unit such as the heatable side exceeds a predefined threshold level, into the tube or into the third tank. Said means for discharging said concentrate may comprise an actuated valve such as a magnet valve. In particular, said valve is suitable for rapid opening and closing in order to mechanically remove incrustations. Said distillation unit may comprise an operating unit for initiation, in particular regularly, of rapid opening and closing of said actuated valve in order to remove said incrustations.

The water purification system may comprise at least one decontamination means for decontaminating said water, said distilled water and/or said enriched distilled water by means of silver, in particular silver ions. Silver ions may work as a contact catalyst for microbial decontamination of fluids. Said decontamination means typically provides a contact surface for contacting the fluid to be contaminated and/or releases silver ions into said fluid. Said decontamination means may e.g. be wire-like and inserted into at least one tube through which any of the described fluids flows during use of the water purification system as intended. In one embodiment, the decontamination means is suitable for producing hydrogen peroxide for disinfecting said distilled water and/or said enriched distilled water.

The water purification system may comprise a second sensor for determining the liquid level inside the evaporation section.

In particular, the second sensor is suitable to measure the water level. The system may further comprise a regulating device for regulating the inflow into the evaporation section, e.g. a suitable valve or a pump. Said second sensor and said regulating device may be connected to a suitable control device for controlling the fluid level inside the evaporation section, e.g. for keeping it constant.

In one embodiment, the system further comprises a discharging means for discharging the fluid, in particular the concentrate, from the evaporation section, e.g. a valve. This helps to prevent overconcentration of the concentrate and, thus, keeps the process efficient and safe.

In another embodiment, the system comprises a temperature sensor suitable to determine a temperature within the evaporation section. The temperature sensor may be connected to the controlling device to enable it for automatically switching off the first Peltier effect device in case the temperature exceeds a predefined value. This renders the system safer, as overheating is prevented.

In one embodiment, the water purification system comprises an adsorption unit for the adsorptive removal of compounds, wherein in particular said adsorption unit is integrated in said first admixing unit.

An adsorption unit is a unit which is configured to bring a comprised adsorbent, e.g. activated carbon, into contact with a liquid or gas phase, e.g. said water and/or said distilled water.

Water compounds such as dissolved organic compounds or volatile organic compounds can be removed due to adsorption processes and accumulate on the adsorbent. The adsorption unit is typically arranged downstream the condensation section.

Said adsorption unit is in particular integrated into said first admixing unit which can be a cartridge. Thus, said cartridge may comprise an admixing section and an adsorption section, e.g. filled with activated carbon. These sections may overlap and/or be realized as a combined admixing/adsorption section. This embodiment is advantageous, as volatile organic compounds which may potentially pass the distillation unit can safely and easily be removed. By replacing the cartridge after exhausting the compounds to be admixed, the user also adds fresh activated carbon. Thus, the adsorption capacity can be re-established at the same time.

In one embodiment, the water purification system comprises a first one-way valve, in particular a first check valve, which is arranged upstream of the evaporation section and/or a second one-way valve, in particular a second check valve, which is arranged downstream of the evaporation section.

In one embodiment, the water purification system comprises a first check valve which is arranged between a heat exchanging section of the distillation unit and said input section for preventing a backflow of preheated water from said heat exchanging section into the direction of said input section. A backflow is a flow in a different direction than the desired flow direction during use as intended.

In another embodiment, the water purification system comprises a second check valve which is arranged between said condensation section and said first cooling unit for preventing a backflow of said distilled water and/or said steam from said first cooling unit into the direction of said condensation section.

In yet another embodiment, the water purification system comprises a third one-way valve, in particular a third check valve, which is in fluid connection with said condensation section and which is open towards the environment in such a way that surrounding air can be let in in order to compensate for negative pressure. An outflow of any medium contained in any section connected to said condensation section is prevented. Said third check valve may be arranged in said first cooling unit, said condensation section and/or said evaporation section and it is in particular arranged between said condensation section and said first cooling unit. In one embodiment, it is arranged between said condensation section and said second check valve.

In yet another embodiment, said water purification system comprises a fourth one-way valve, in particular a fourth check valve, which is in fluid connection with said evaporation section and serving as a pressure relief valve. Said third and fourth one-way valves may be combined in a combined valve. Said third and/or fourth one-way valves may be arranged in a cover or wall of said evaporation section.

Negative pressure may in particular occur when the water purification system is switched off and the evaporation section cools down and, thus, steam contained within said evaporation section and/or said condensation section condenses. Said third check valve prevents water from the input section, a heat exchanging section of the distillation unit and/or the condensation section to be sucked into the condensation section due to said negative pressure. Thus, the safety of the system is further increased, as an arrival of untreated water at the output section is effectively prevented.

In a further embodiment of the water purification system, said distillation unit is a distillation unit according to the invention. Thus, the water purification system is able to produce distilled water in a very cost-effective and energy-efficient way.

A second aspect of the invention is a distillation unit, comprising a first Peltier effect device. Said first Peltier effect device has a heatable side, providing an evaporation section for evaporating a raw liquid, producing a gas phase, and a coolable side, providing a condensation section for partly condensing said gas phase, producing a two-phase mixture comprising distilled liquid and said gas phase. The distillation unit further comprises a heat exchanging section to preheat said raw liquid prior to evaporation. Said heat exchanging section is arranged and configured in such a way that thermal energy is transferable from said two-phase mixture to said raw liquid, preheating said raw liquid while at least partly condensing said gas phase comprised in said two-phase mixture.

This aspect covers a distillation unit with a Peltier effect device that is particularly suitable for use in a water purification system according to the invention.

The heat exchanging section is suitable to preheat the raw liquid which is the liquid to be purified while contributing to evaporation of the two-phase mixture. Condensation of said gas phase comprised in said mixture is typically partial, as described.

Said heat exchanging section is typically a chamber or, in other words, a separated volume, for receiving raw liquid to be preheated. In particular, said raw liquid to be preheated flows through said heat exchanging section. In particular, said heat extending section does not serve for storing said raw liquid to be preheated. Said heat exchanging section is arranged and configured in such a way that thermal energy from is transferable said two-phase mixture produced in said condensation section to said raw liquid.

Said heat exchanging section is typically in thermal connection with said condensation section in order to transfer said thermal energy from said two-phase mixture to said raw liquid. It may be separated from said condensation section by a heat exchanging element such as a heat exchanging wall. Typically, there is a first flow path for the raw liquid to enter said heat exchanging section and a second flow path between said heat exchanging section and said evaporation section for leading said preheated raw liquid to said evaporation section. Said flow paths connect said heat exchanging section to the respective sections or units in order to form suitable fluid connections.

If said distillation unit is part of the water purification system said first flow path typically connects said input section of said water purification system to said distillation unit, namely said heat exchanging section.

Specifications of said evaporation section and said condensation section are described above in the context of said water purification system. All specifications and embodiments of parts of said water purification system also apply for the respective parts of said distillation unit and vice versa.

In a typical distillation process using the distillation unit according to the invention, the raw liquid flows through a heat exchanging section. It is preheated to nearly 100° C. and flows to the evaporation section where it is evaporated via the heatable side of the first Peltier effect device. The produced gas phase is fed to the condensation section with a connecting element. Between the evaporation section, which may be realized as an evaporation chamber, and the inflow of the connecting element, a droplet separator may be arranged in order to prevent raw liquid droplets from entering the condensation section. Said droplet separator may be a net or screen or a device for cyclonic separation. In the condensation section, the gas phase partly condenses due to the cold produced by the coolable side of the first Peltier effect device and partly due to the coolness of the raw liquid flowing separated by a heat exchanging surface.

The evaporation section may be suitable for the production of 0.1-2 kilograms per hour, in particular 0.2-1 kilogram per hour.

The described heat exchange contributes to a high efficiency. By heat transfer from the two-phase mixture, efficiency is even increased and less effort is needed for a subsequent cooling of the distilled liquid. Thus, the described heat exchanging section renders the process very efficient.

Typically, a connecting element is arranged between said evaporation section and said condensation section of said distillation unit for realizing a flow path between said sections. Said flow path enables the produced gas phase to enter said condensation section.

In one embodiment of the distillation unit, said heatable side comprises a heat transfer element, in particular enlarging the surface area of said heatable side, which is arranged and configured in such a way that a thermal interaction between said heatable side and said raw liquid can be established.

In one embodiment, said distillation unit comprises a heat transfer element for transferring thermal energy from said heatable side to said raw liquid. Said heat transfer element is in thermal connection with said heatable side of said first Peltier effect device, in particular enlarging the surface area of said heatable side. Said heat transfer element is arranged and configured in such a way that a thermal interaction between said heatable side and said raw liquid can be established. It may be arranged between said heatable side and a volume of said evaporation section.

The heat transfer element is, thus, at least partly contactable by the raw liquid, such that heat is transferrable to said raw liquid. It is in particular thermally connected with said heatable side of said first Peltier effect device and may enlarge the surface area of said heatable side in order to increase the heat transfer to the raw liquid at a small construction volume. This is e.g. possible with heat exchange fins. Therefore, a compact and space-saving design of the distillation unit is possible in combination with a very effective heat transfer. It may comprise heat transfer fins and/or a suitable microstructure, e.g. also comprising fins, in order to provide a maximum surface area.

Additionally, the heat transfer element may be designed to ensure a mechanical stability by providing an increased geometrical moment of inertia in the direction of twisting. Said twisting may occur when mounting the heat transfer element to the heatable side of the first Peltier effect device: As the side of the heat transfer element is designed to contact the heatable side in a maximum contact surface, a fixed connection is to be established, which may lead to twisting. The heat transfer element thus increases the stability of the entire distillation unit. Therefore, the parts of the distillation unit can be mounted without leading to a curvature in any of the parts. Said heat transfer element acts as a mechanical stiffening element.

In one embodiment, said condensation section comprises a cooling element which is thermally connectable or connected with said coolable side, wherein said cooling element in particular enlarges the surface area of said coolable side and said cooling element is at least partly contactable by said steam or said two-phase mixture such that thermal energy is transferrable from said steam or said mixture to said coolable side via said cooling element. Said cooling element may be manufactured analogous or similar to the described heat transfer element.

The condensation section provides a volume for the steam to be at least partly condensed, said volume is delimited on one side by a partitioning wall towards an inflow water chamber and on another side by said coolable side of the first Peltier effect device, or, if applicable, to said cooling element which is thermally connected to said coolable side. All specifications given for the heat transfer element may also hold for the cooling element.

The preheating section may be an inflow water chamber which may be a flat chamber, e.g. only 0.5-2 mm high. Water may flow through said chamber in a thin film and thus be preheated effectively.

In another embodiment, said heat exchanging section is thermally connected with said condensation section so that said gas phase comprised in said two-phase mixture can at least partly be condensed inside said condensation section.

In particular, said condensation section is a separated volume which is thermally connected with said coolable side of said first Peltier effect device or, if applicable, with said cooling element. In addition, in this embodiment, said condensation section is thermally connected with said heat exchanging section. In particular, said heat extending section and said heatable side of said first Peltier effect device or said heat transfer element are arranged on opposing sides of said condensation section. Said opposing sides are typically formed as walls of said condensation section, partly delimiting said volume of said condensation section with respect to the exterior. The condensation section is arranged and configured in such a way that a thermal interaction between the evaporated liquid and the coolable side can be established. While transferring thermal energy from said remaining gas phase to said raw liquid, at least parts of the remaining gas phase condense, forming distilled liquid. Typically, the temperature inside the condensation section remains essentially constant at approx. 100° C. Thermal energy may be transferred from said steam directly to the adjacent cooling element.

This embodiment achieves a very space-saving integral design, as the evaporation section is realized as a dual-function space for transferring heat from the steam to the first Peltier effect device and to the incoming raw water. In this way, for example two opposing sides of said space can be used for heat transfer. This also brings advantages in terms of energy efficiency.

The water to be evaporated may pass the heat exchanging section, realized as a flat chamber formed by an outer wall of the distillation unit and a heat exchanging wall between the condensation section and the heat exchanging section. Said heat exchanging section may be located on the lower side of the distillation unit below the condensation section during use as intended. In this hollow space the incoming water is heated up with heat provided by the steam to be condensed or the two-phase mixture, comprising steam to be condensed.

Subsequently, the preheated water is led to the evaporation section which is located on the upper side of the first Peltier effect device during use as intended. It is evaporated through contact with the heat transfer element which is heated with the heatable side of the first Peltier effect device. The steam rises up above the water level where a connecting element is arranged connecting said evaporation section and said condensation section. It is led to the condensation section where it contacts the cooling element, transferring heat to the coolable side of the first Peltier effect device. Additionally and, in particular, simultaneously, it transfers heat to the raw water through the heat exchanging wall with the heat exchanging section.

The tubes may be manufactured from PEX, cross linked polyethylene; polyoxymethylene; polyethylene; linear low density polyethylene; acetal; polyvinylidene flouride (PVDF); perfluoroether; fluorinated ethylene propylene; stainless steel. For the fittings, polypropylene, stainless steel, polyvinylidene flouride and/or ethylene propylene diene monomer M-class rubber may be used. For the seal, Polytetrafluoroethylene, may be used.

In particular, preheating of inflow water by steam, transferring latent heat from the steam to the inflow water, and condensing of steam with the coolable side are realized simultaneously. Inflowing water may be heated to a temperature up to approx. 100° C. and a great portion of steam comprised in the two-phase mixture present in the condensation section may be condensed.

This embodiment renders the construction size still smaller and enables for a cost-effective design of the distillation unit.

In one embodiment, the distillation unit is configured in such a way that said distilled liquid is removable from said condensation section and/or from said heat exchanging section.

In one embodiment, said heat transfer element is realized as a metal piece, in particular made from aluminum. It comprises a compact metal block having a plurality of fins, in particular formed by milling, and/or cutting, which protrude from a first side of the compact metal block, forming an outer second side which is essentially planar and comprises a plurality of recesses between said fins. The first side contacts the heatable side of the first Peltier effect device, leading to an effective distribution of the produced heat and dissipation into the water to be evaporated, as the water is to be positioned between said fins.

Said heat transfer element may comprise a coating manufactured from at least one coating material chosen from the following: fluoropolymer; silicon aluminum oxynitride; metal oxides, in particular aluminum oxide; silicon dioxide; furan resins; titanium oxide.

Fluoropolymers are fluorocarbon-based polymers with multiple strong carbon-fluorine bonds, particularly having a high resistance to solvents, acids and bases. Among them, there are PVF (polyvinylfluoride), PVDF (polyvinylidene fluoride), PTFE (polytetrafluoroethylene), PCTFE (polychlorotrifluoroethylene), PFA (perfluoroalkoxy polymer), FEP (fluorinated ethylene-propylene), ETFE (polyethylenetetrafluoroethylene), ECTFE (ethylene chlorotrifluoroethylene or polyethylenechlorotrifluoroethylene), FFPM/FFKM (Perfluorinated Elastomer or Perfluoroelastomer), FPM/FKM (Fluorocarbon or Chlorotrifluoroethylenevinylidene fluoride), FEPM (Fluoroelastomer or Tetrafluoroethylene-Propylene), PFPE (Perfluoropolyether), PFSA (Perfluorosulfonic acid), Perfluoropolyoxetane. In particular, PFA, PTFE, ECTFE and/or FEP or, alternatively, PEEK (Polyetheretherketone) may be used.

Silicon aluminum oxynitrides, also known as SiAlON, are ceramics based on silicon, aluminum, oxygen and nitrogen. They withstand high temperatures and thermal shocks and comprise a high strength and good resistances to wetting and corrosion.

In general, ceramic coatings are in particular used for realizing food-safe coatings on metal objects such as said heat transfer element which can be manufactured from aluminum. Said coating is in particular used to prevent metal ions from dissolving into any of the water, distilled water or steam phases.

Furthermore, metal oxides may be used such as aluminum oxide. A formed oxide layer, e.g. based on the base material, may be infused with polymers such as sub-micron sized particles of polymers such as fluoropolymers with high temperature resistance and low friction properties.

Alternatively, said heat transfer element and/or said cooling element may be made from stainless steel, copper or aluminum.

Furan resins can e.g. be obtained analogously to phenol formaldehyde resins by replacing formaldehyde by furfural in their formulation, e.g. based on furfural and phenol.

Typically, the heatable side, the coolable side and, if applicable, the heat transfer element and/or the cooling element are produced from stainless steel, copper, aluminum and/or an alloy comprising at least one of the two materials. To prevent contamination and/or re-contamination and to still achieve an effective heat transfer, one or more of the defined materials is used for coating, in particular for non-stick coating. In one embodiment, all inner walls of said evaporation section, said condensation section and, if applicable, said heat exchanging section are made from stainless steel, copper, aluminum and/or an alloy comprising at least one of said materials.

In the group of fluoropolymers, the coating can be produced from one or more of the following: Ethylene chlorotrifluoroethylene, Ethylene tetrafluoroethylene, perfluoroalkoxy alkanes, polytetrafluoroethylene, fluorinated ethylene propylene, polyether ether ketone, perfluorooctanoic acid.

In particular, all elements forming the evaporation section and the condensation section of the water distillation unit, e.g. all parts potentially contacting the raw liquid, the gas phase, the two-phase mixture and/or the distilled liquid, comprise said coating.

In a further embodiment, a connecting element is arranged between said evaporation section and said condensation section for realizing a flow path between said sections. Said flow path is located essentially outside the volume enclosed by said distillation unit.

In particular, a closed flow path is provided for leading said gas phase, in particular steam, from the evaporation section to the condensation section. Here, the flow path is realized by an external structure such as a hose or a tube. In other words, said connecting element is located essentially outside said enclosed volume. This is a simple and cost-effective way of realizing the necessary connection.

In an alternative embodiment, a connecting element is arranged between said evaporation section and said condensation section for realizing a flow path between said sections. Said flow path is located essentially inside the volume enclosed by said distillation unit. In particular, said flow path runs essentially perpendicular to the plane of said first Peltier effect device and/or crosses said plane essentially in the center of said distillation unit.

In particular, a closed flow path is provided, leading directly from the evaporation section to the condensation section inside the distillation unit. Particularly, the flow path is a hollow space which is manufactured together with the respective sections. It may comprise a pipe section projecting above the plane defined by the water level inside the evaporation section, during use as intended, preventing liquid from entering the condensation section. The length of the projection may be more than two centimeters and in particular more than five centimeters. The pipe section may be positioned in the center of the evaporation section and, in particular, in the center of the liquid compartment formed by the evaporation section. This prevents liquid to enter the condensation section in most positions of the distillation unit or of the water purification system comprising said unit.

In a further embodiment, the distillation unit comprises two temperature sensors, wherein a first temperature sensor is adapted to measure a temperature of a liquid inside the evaporation section and a second temperature sensor is adapted to measure the temperature of said heat transfer element. An increase in the resulting temperature difference is an indication for scaling of said heat transfer element which can be used for initiating a process for removing incrustations.

The invention also provides a process for removing incrustations, in particular containing lime, from the distillation unit. It comprises the steps providing a distillation unit according to the invention and leading a liquid with a temperature below 50° C. into the evaporation section, in particular said raw liquid at a temperature between 5° C. and 35° C. The liquid is heated, particularly above 60° C. and more particularly above 80° C. This leads to a removal of incrustations and a forming of flakes. Said flakes contained in said liquid are then withdrawn from the evaporation section by draining the liquid. This may be realized with a possibly comprised discharging means, as described. This process may be repeated several times, if necessary, to increase the removal effectivity of said incrustations. A temperature sensor, as described, may be used to control the temperature profile of said process.

In particular, the hot water contained within the evaporation section is removed prior to feeding the cool liquid into said section. One or more rinsing steps may be performed for an effective removal of formed flakes. All steps of the described process may be controlled by a controlling device and performed automatically.

Another aspect of the invention is a computer program, particularly an app, which can be loaded into the internal, in particular non-volatile, memory of a digital computer and which comprises sections of software code that, if performed on said digital computer, realizes steps to be performed by the water purification system according to the invention.

The invention is further illustrated and characterized by the following figures that show certain examples from which further embodiments and advantages can be drawn. These figures are meant to illustrate the invention but not to limit its scope.

Figure 1:
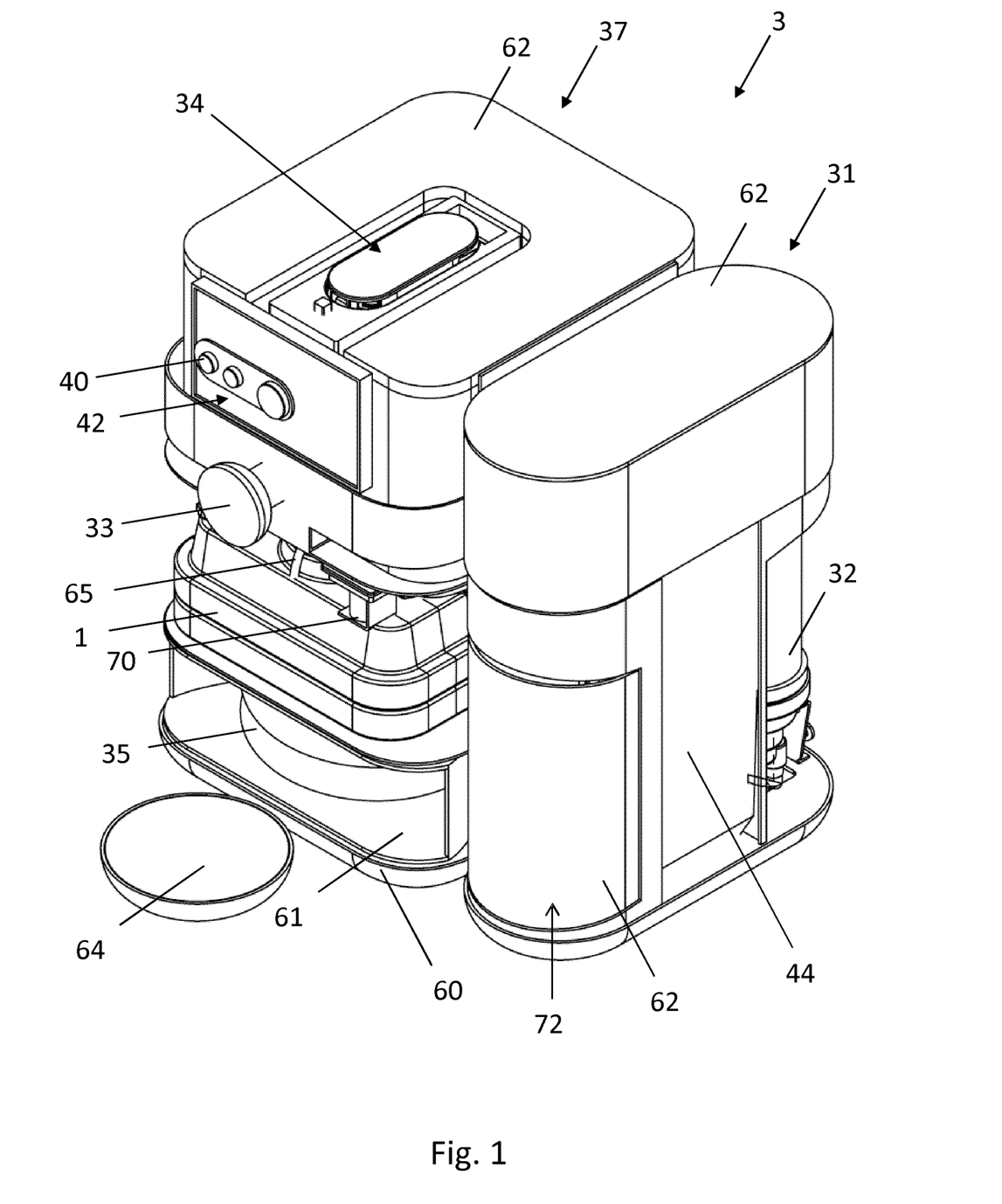
FIG. 1 shows a partially cutaway perspective view of a water purification system according to the invention.

FIG. 1 shows the water purification system 3 comprising an input section 31, realized as raw water tank 44 which is T-shaped in side view and covered by a lid 62. On the back of said input section 31 a first admixing unit 32 is arranged and on its front, a waste water tank 72 is arranged, covered by another lid 62. The distillation unit 1 is positioned on the left hand side above a heat transfer zone of the first cooling unit 35 which is surrounded by an air inlet/outlet 61, creating an air flow channel. A first tube 65 is arranged between evaporation section 12 (not shown) of the distillation unit 1 and the waste water tank 72, which is positioned behind another lid 62, in order to remove the produced concentrate periodically, which is controlled via the valve 70 within said first tube 65.

The ready-to-use product is dispensed with the output section 33. Manual starting of the dispensing of enriched distilled water is possible using the input unit 40, realized as knobs on the interface 42. Several knobs provide functions such as dispensing predefined amounts of distilled enriched water and/or dispensing a definable amount of distilled enriched water. LEDs (not shown) comprised in said interface 42 serve as output unit for displaying information.

On the top of the left hand side, the first tank 37 is located for storing the enriched distilled water. It is arranged around the second admixing unit 34 and covered by another lid 62. In front of the main module of the water purification system 3, a drip tray 64 is positioned.

The housing 60 that surrounds most of the functional modules is partially cutaway in this view for a better visibility.

Figure 2:
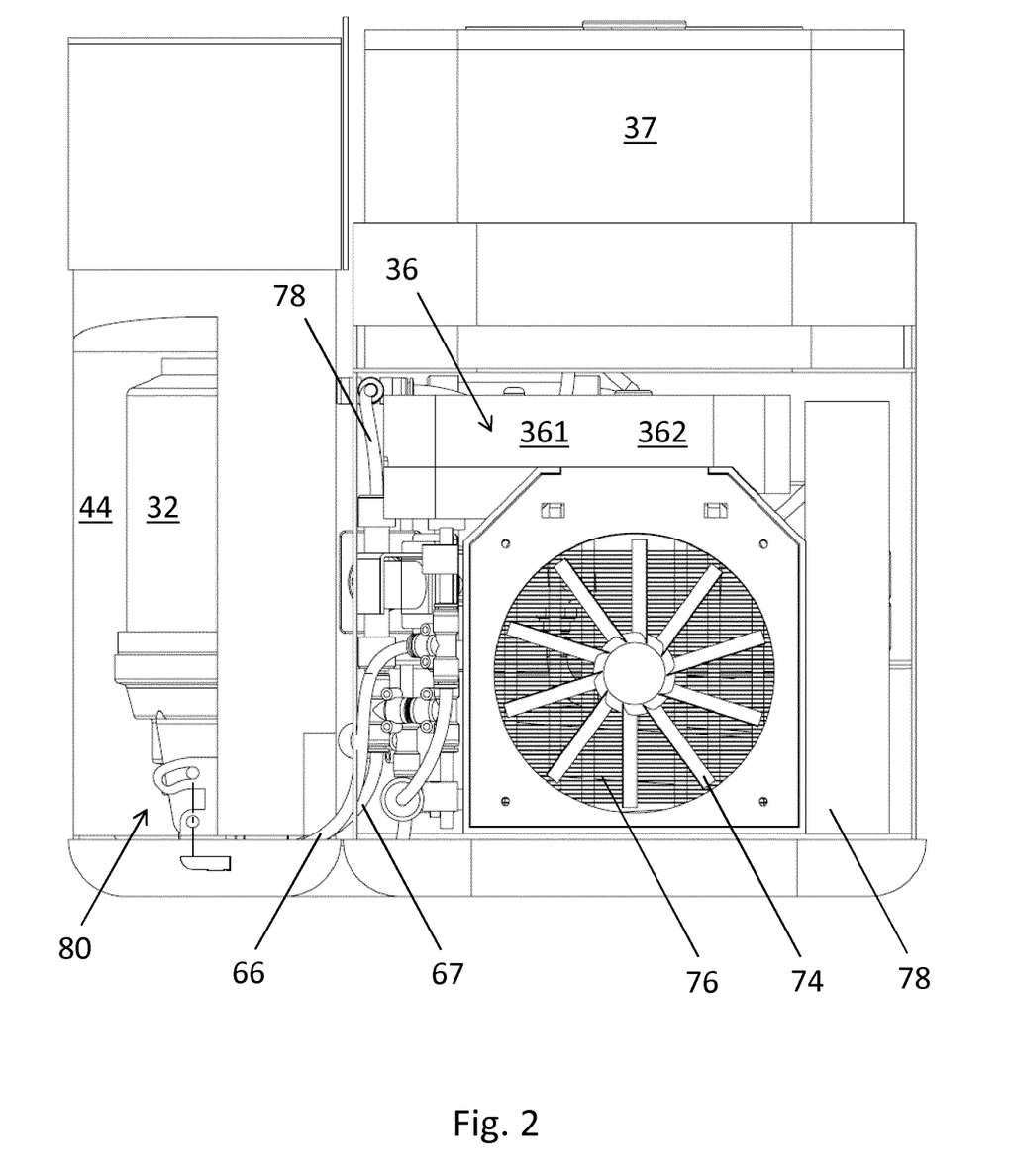
FIG. 2 shows a back view of the same water purification system.

In the back of the water purification system 3, shown in FIG. 2, the first admixing unit 32 is visible on the left hand side. It is realized as a multi-use cartridge connected to a cartridge changing mechanism 80. Behind said cartridge the raw water tank 44 is positioned. Said cartridge is connected to the first cooling unit 35 (not shown in this view) and to the first tank 37 via a second tube 66 and a third tube 67, respectively. A fourth tube 68 connects the distillation unit 10 with the raw water tank 44 (both not shown in this view).

A fan 74 for producing an air stream is shown. Said air stream takes up waste heat from the second cooling unit 36 and the first cooling unit 35 in a counter-current principle. Behind the fan 74, cooling fins 76 are visible which are connected to the second cooling unit 36 are visible. Said second cooling unit 36 is located in a box above the fan 74 and is used for transferring waste heat from the second side of the second Peltier effect device 361. Said second side is typically used to dissipate the heat that is generated while cooling the heat transfer surface 362 in order to refrigerate said enriched distilled water.

On the right hand side, the power supply unit 78 is located

Figure 3:
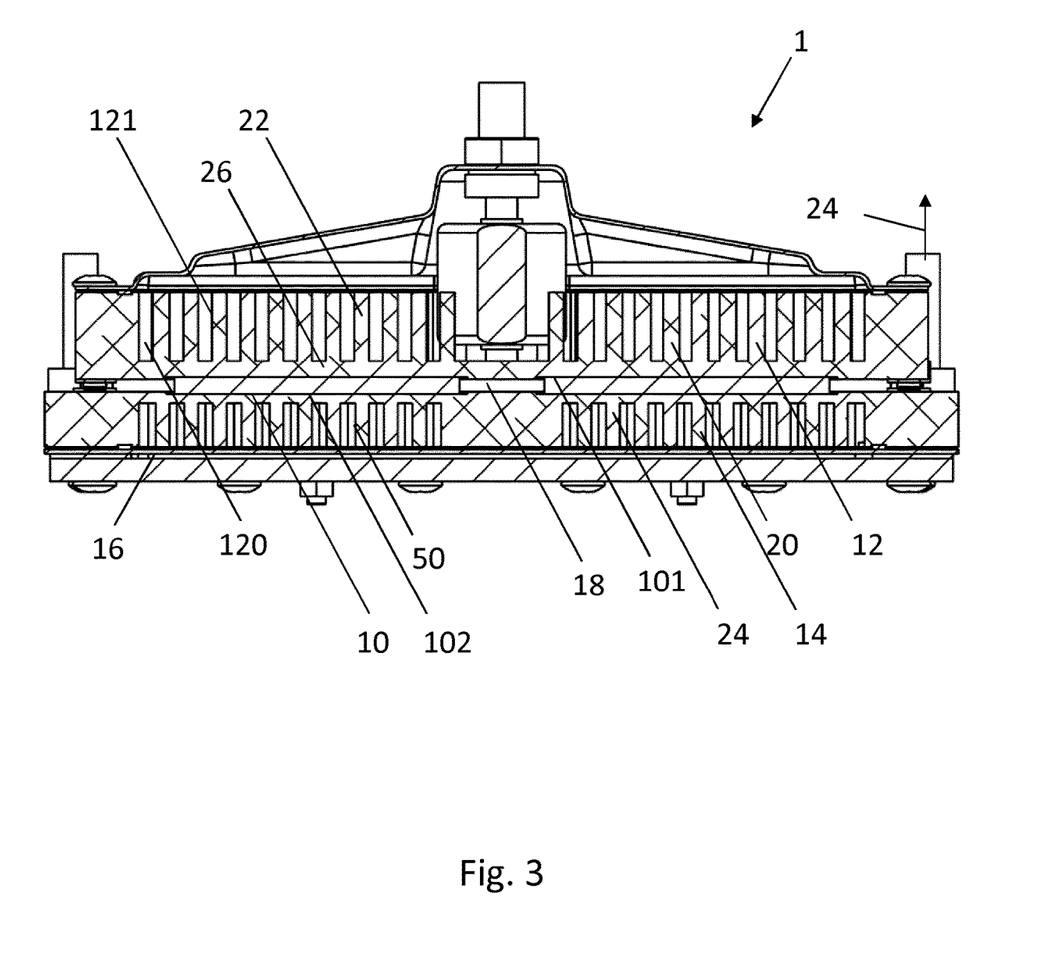
FIG. 3 shows a cross section of a distillation unit according to the invention.

FIG. 3 shows a cross section of the distillation unit 1 comprising the first Peltier effect device 10 with a heatable side 101 and a coolable side 102. Said first Peltier effect device 10 is arranged between two chambers defined as the evaporation section 12, positioned on the upper side, and the condensation section 14, positioned on the lower side. The small horizontal gap arranged below the condensation section 14 is the heat exchanging section 16 for preheating the raw liquid 20 prior to evaporation. Thus, the heat exchanging section 16 is thermally connected with both the coolable side 102 and the condensation section 14.

After preheating, the raw liquid 20 is led to said evaporation section 12. It is evaporated producing a gas phase 22 which is led to the condensation section 14 via the connecting element 18. Said connecting element 18 is located inside the volume enclosed by said distillation unit 1 and runs perpendicular to the plane of said first Peltier effect device 10, crossing said plane in the center of said distillation unit 1. In the condensation section 14, a two-phase mixture 24 is produced which comprises distilled liquid 26 and said gas phase 22. Said two-phase mixture 24 leaves the condensation section 14 on the upper right and is led to the first cooling unit (not shown).

The heatable side 101 comprises a heat transfer element 120 enlarging its surface area, with a food-safe coating 121 which surrounds all parts of said heat transfer element 120 which may get into contact with liquid. The coolable side 102 comprises a second heat transfer element 50.

Figure 4:
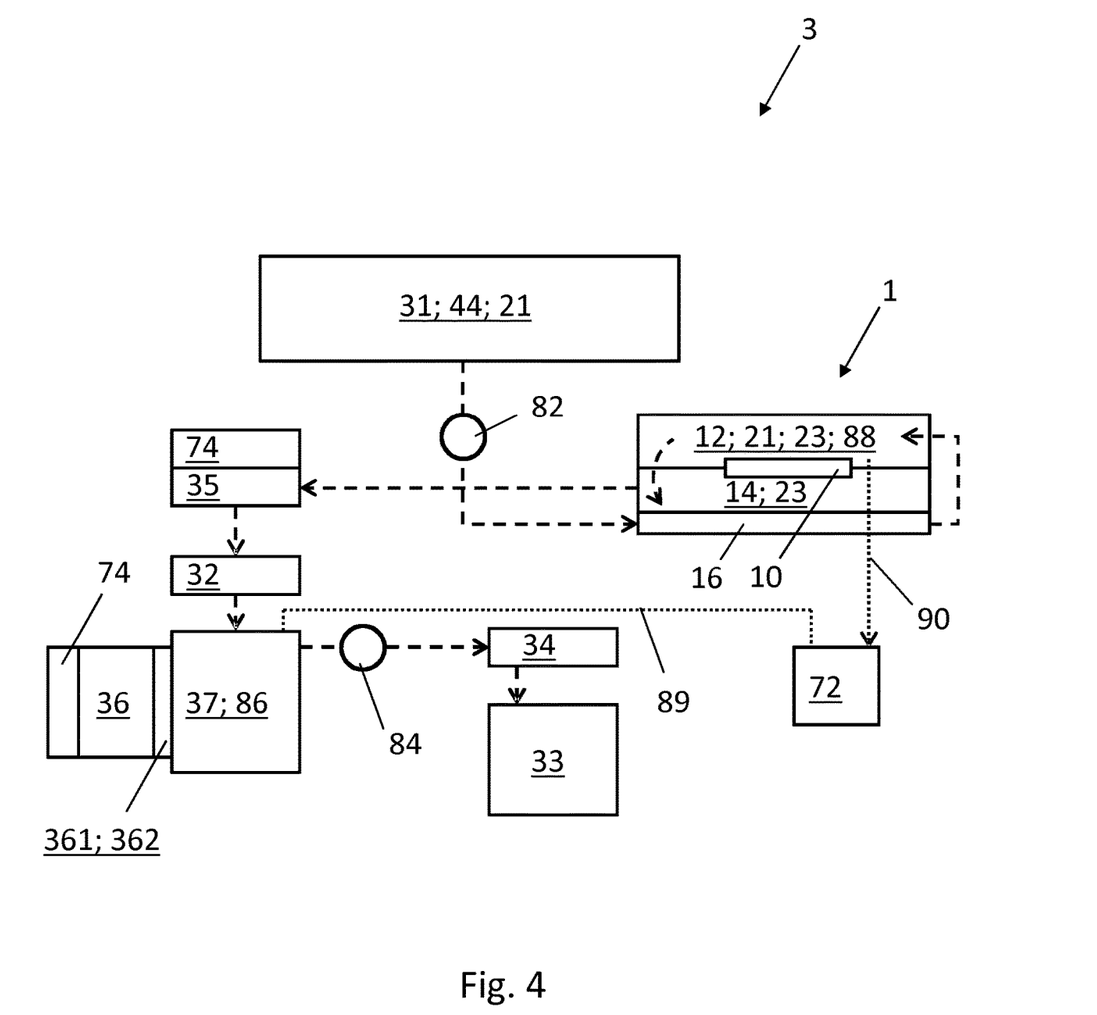
FIG. 4 shows a schematic view of a purification process as performed in a water purification system according to the invention.

FIG. 4 shows the flow paths from the raw water 21 in the raw water tank 44 serving as input section 31 to the final enriched distilled water with additional ingredients which can be dispensed from the output section 33.

The raw water 21 is pumped to the distillation unit 1 with a first pump 82. It enters the preheating section 16 to be preheated by excess heat of the two-phase mixture inside the adjacent condensation section 14. The preheated raw water 21 is led to the evaporation section 12 to be evaporated. Steam 23 is produced. A second sensor 88 is located inside said evaporation section 12 for determining and controlling the liquid level inside said evaporation section 12 by controlling said first pump 82. A concentrate line 90 connects the evaporation section 12 with the waste water tank 72.

Produced steam 23 is led to the condensation section 14 where heat is transferred to the coolable side 102 (not shown) of the Peltier effect device 10 and to the raw water 21 inside the preheating section 16. A two-phase mixture comprising water and steam is produced. Said mixture is led to the first cooling unit 35 where the remaining comprised steam is condensed to distilled water. Excess heat is transferred to an air flow with the help of a fan 74. The produced warm distilled water is led to the first admixing unit 32 where minerals are added in order to produce purified drinking water which is led to the first tank 37. Attached to said first tank 37 is a cooling circuit comprising a second cooling unit 36 with a second Peltier effect device 361 comprising a heat transfer surface 362 and a second side which is again thermally connected to an air flow produced by a fan 74. With this cooling circuit, the water temperature inside the first tank 37 can be controlled. A first sensor 86 for the determination of total dissolved solids is arranged in a tubing near the first tank 37 to control the distillation process.

The tempered water is pumped to the second admixing unit 34 where flavouring ingredients are added by means of a second pump 84. It is led to the output section 33. The first tank 37 further comprises a fluid connection to the waste water tank 72 in the form of an overflow 89.

LIST OF REFERENCE SIGNS distillation unit 1
first Peltier effect device 10
heatable side 101
coolable side 102
evaporation section 12
heat transfer element 120
coating 121
condensation section 14
heat exchanging section 16
connecting element 18
raw liquid 20
water 21
gas phase 22
steam 23
two-phase mixture 24
distilled liquid 26
water purification system 3
input section 31
first admixing unit 32
output section 33
second admixing unit 34
first cooling unit 35
second cooling unit 36
second Peltier effect device 361
heat transfer surface 362
first tank 37
input unit 40
interface 42
raw water tank 44
second heat transfer element 50
housing 60
air inlet/outlet 61
lid 62
drip tray 64
first tube 65
second tube 66
third tube 67
fourth tube 68
valve 70
waste water tank 72
fan 74
cooling fins 76
power supply unit 78
cartridge changing mechanism 80
first pump 82
second pump 84
first sensor 86
second sensor 88
overflow 89
concentrate line 90

The invention claimed is:

1. Water purification system (3), comprising
an input section (31) for providing water (21) to a distillation unit (1),
said distillation unit (1) for producing distilled water, comprising an evaporation section (12) for evaporating said water (21) and producing steam (23), and a condensation section (14) for at least partly condensing said steam (23), producing distilled water,
a first admixing unit (32), which is arranged and configured in such a way that it is enabled for admixing compounds, to said distilled water, producing enriched distilled water, and
an output section (33) for dispensing said enriched distilled water,
characterized in that said evaporation section (12) is provided by a heatable side (101) of a first Peltier effect device (10) and said condensation section (14) is provided by a coolable side (102) of said first Peltier effect device (10), wherein the water purification system (3) comprises an adsorption unit for the adsorptive removal of compounds, wherein said adsorption unit is integrated in said first admixing unit (32).

2. Water purification system (3) according to claim 1, characterized in that it comprises a second admixing unit (34) arranged downstream of said condensation section (14), wherein said second admixing unit (34) is configured in such a way that it is enabled for admixing ingredients to said distilled water and/or to said enriched distilled water.

3. Water purification system (3) according to claim 2, characterized in that said second admixing unit (34) is suitable to admix ingredients retained in an ingredient capsule, said second admixing (34) unit comprising a capsule positioning element to fix said ingredient capsule during an admixing process.

4. Water purification system (3) according to claim 1, characterized in that it comprises a first cooling unit (35) suitable for transferring thermal energy from said distilled water and/or said steam (23) to an air flow, said first cooling unit (35) being arranged downstream of said condensation section (14) and upstream of said output section (33).

5. Water purification system (3) according to claim 4, characterized in that it comprises a second cooling unit (36) having a second Peltier effect device (361) with a heatable and/or coolable heat transfer surface (362), said second cooling unit (36) being arranged downstream of said condensation section (14) and upstream of said output section (33); said heat transfer surface being suitable for transferring thermal energy to and from said distilled water and/or said enriched distilled water.

6. Water purification system (3) according to claim 5, characterized in that it comprises a first tank (37) for storing said distilled water and/or said enriched distilled water, said first tank (37) being arranged downstream of said condensation section (14), wherein said second cooling unit (36) is arranged and configured in such a way that it is enabled to increase and decrease the water temperature in said first tank (37).

7. Water purification system (3) according to claim 1, characterized in that it comprises at least one first sensor (86) for the determination of total dissolved solids, said first sensor (86) being arranged upstream of said output section (33), and/or that it comprises a second sensor (88) for determining a liquid level inside the evaporation section (12).

8. Water purification system (3) according to claim 1, wherein the admixing compounds are minerals.

* * * * *